US012477167B2

(12) United States Patent
Gorman et al.

(10) Patent No.: US 12,477,167 B2
(45) Date of Patent: Nov. 18, 2025

(54) ACCESSORY FOR ELECTRONIC DEVICE INCLUDING BROADCAST SIGNAL TUNER

(71) Applicant: Apple Inc., Cupertino, CA (US)

(72) Inventors: Daphne I. Gorman, San Jose, CA (US); Wassim El-Hassan, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 18/592,372

(22) Filed: Feb. 29, 2024

(65) Prior Publication Data

US 2024/0323471 A1    Sep. 26, 2024

Related U.S. Application Data

(60) Provisional application No. 63/454,530, filed on Mar. 24, 2023.

(51) Int. Cl.
| | |
|---|---|
| *H04N 21/41* | (2011.01) |
| *G06F 3/0346* | (2013.01) |
| *G06F 3/0354* | (2013.01) |
| *H04N 21/414* | (2011.01) |
| *H04N 21/426* | (2011.01) |
| *H04N 21/4363* | (2011.01) |
| *H04N 21/643* | (2011.01) |

(52) U.S. Cl.
CPC ..... *H04N 21/41265* (2020.08); *G06F 3/0346* (2013.01); *G06F 3/03545* (2013.01); *H04N 21/41407* (2013.01); *H04N 21/42607* (2013.01); *H04N 21/43637* (2013.01); *H04N 21/643* (2013.01)

(58) Field of Classification Search
None
See application file for complete search history.

(56) References Cited

U.S. PATENT DOCUMENTS

| | | | |
|---|---|---|---|
| 9,681,183 B1 | 6/2017 | Mahmood | |
| 2008/0231614 A1* | 9/2008 | Huang | G06F 1/1698 |
| | | | 345/179 |
| 2010/0056206 A1* | 3/2010 | Tai | H01Q 1/44 |
| | | | 343/900 |
| 2012/0047277 A1* | 2/2012 | Keidar | H04L 65/65 |
| | | | 348/731 |
| 2017/0111689 A1 | 4/2017 | Garcia et al. | |
| 2023/0187971 A1* | 6/2023 | An | G06F 3/038 |
| | | | 320/108 |

FOREIGN PATENT DOCUMENTS

WO    WO2012/024444    2/2012

* cited by examiner

*Primary Examiner* — Omar S Parra
(74) *Attorney, Agent, or Firm* — Brownstein Hyatt Farber Schreck, LLP

(57) ABSTRACT

A stylus usable with an electronic device to provide an input to the electronic device, may include a stylus body, a battery within the stylus body, a first antenna configured to receive a broadcast signal, the broadcast signal including video content, a second antenna configured to communicate with a remote electronic device via a wireless communication protocol, and a processing system configured to receive the broadcast signal from the antenna, demodulate the broadcast signal to produce a digital content signal including the video content, encode the digital content signal according to the wireless communication protocol to produce an encoded digital content signal, and send to the remote electronic device, via the second antenna, the encoded digital content signal.

20 Claims, 12 Drawing Sheets

ACCESSORY FOR ELECTRONIC DEVICE INCLUDING BROADCAST SIGNAL TUNER

CROSS-REFERENCE TO RELATED APPLICATION(S)

This application is a nonprovisional patent application of and claims the benefit of U.S. Provisional Patent Application No. 63/454,530, filed Mar. 24, 2023 and titled "Accessory for Electronic Device Including Broadcast Signal Tuner," the disclosure of which is hereby incorporated herein by reference in its entirety.

TECHNICAL FIELD

Embodiments described herein relate to accessories for electronic devices, and in particular to accessories for electronic devices configured to receive and process broadcast signals, such as broadcast television signals.

BACKGROUND

Electronic devices such as smartphones, tablets, and computers can be invaluable for tasks such as retrieving information, coordinating action, and generally communicating with others. Electronic devices have also become ubiquitous for entertainment, allowing for consumption of audio, video, and other media in a convenient manner. For example, mobile phones and tablet computers typically include high-resolution displays for displaying videos, movies, and the like.

SUMMARY

A stylus usable with an electronic device to provide an input to the electronic device, may include a stylus body, a battery within the stylus body, a first antenna configured to receive a broadcast signal, the broadcast signal including video content, a second antenna configured to communicate with a remote electronic device via a wireless communication protocol, and a processing system within the stylus body. The processing system may be configured to receive the broadcast signal from the first antenna and demodulate the broadcast signal to produce a digital content signal including the video content. The stylus may also include a communication system within the stylus body and configured to receive the digital content signal from the processing system, encode the digital content signal according to the wireless communication protocol to produce an encoded digital content signal, and send to the remote electronic device, via the second antenna, the encoded digital content signal.

The stylus may further include an input sensing system configured to detect a user input at the stylus, and the communication system may be further configured to, in response to detecting the user input, send an input signal, via the second antenna and using the wireless communication protocol, to the remote electronic device. The broadcast signal may be a first broadcast signal encoded according to a first broadcast protocol, the first antenna may be configured to receive a second broadcast signal encoded according to a second broadcast protocol different from the first broadcast protocol, the digital content signal may be a first digital content signal, and the processing system may be further configured to receive the second broadcast signal from the first antenna, partially demodulate the second broadcast signal to produce a partially demodulated second digital content signal, encode the partially demodulated second digital content signal according to the wireless communication protocol to produce an encoded partially demodulated second digital content signal, and send to the remote electronic device, via the second antenna, the encoded partially demodulated second digital content signal.

The first broadcast signal may be transmitted on a first frequency band, the second broadcast signal may be transmitted on a second frequency band, and the first antenna may be configured to receive signals on the first frequency band and the second frequency band.

The stylus may further include a magnetic attachment mechanism coupled to the stylus body and configured to magnetically attach the stylus to the remote electronic device. The first broadcast protocol may be an Advanced Television Systems Committee (ATSC) broadcast protocol, the second broadcast protocol may be a fifth generation (5G) broadcast protocol, and the wireless communication protocol may be a Bluetooth communication protocol. The video content may be first video content, the second broadcast signal may include second video content, and the encoded partially demodulated second digital content signal may include the second video content.

An electronic device system may include an electronic device including a housing, a display coupled to the housing and configured to display graphical outputs, and a cover over the display and defining a front exterior surface of the electronic device. The electronic device system may further include an accessory configured to be removably coupled to the electronic device and including an attachment mechanism configured to removably couple the accessory to the electronic device, a first antenna configured to receive a broadcast signal, the broadcast signal including video content, a second antenna configured to communicate with the electronic device, a processing system configured to receive the broadcast signal from the first antenna, demodulate the broadcast signal to produce a digital content signal including the video content, encode the digital content signal according to a wireless communication protocol to produce an encoded digital content signal, and send to the electronic device, via the second antenna, the encoded digital content signal. The electronic device may be a tablet computer. The accessory may be a stylus configured to provide an input to the tablet computer via contact with the cover.

The processing system may be a first processing system, and the electronic device may include a second processing system configured to receive the encoded digital content signal, decode the encoded digital content signal to retrieve the digital content signal, and display the video content on the display using the digital content signal. The broadcast signal may be a first broadcast signal encoded according to a first broadcast protocol, the video content may be first video content, the first antenna may be configured to receive a second broadcast signal encoded according to a second broadcast protocol different from the first broadcast protocol, the second broadcast signal including second video content, the digital content signal may be a first digital content signal, and the first processing system may be further configured to receive the second broadcast signal from the first antenna, partially demodulate the second broadcast signal to produce a partially demodulated second digital content signal, encode the partially demodulated second digital content signal according to the wireless communication protocol to produce an encoded partially demodulated second digital content signal, and send to the electronic device, via the second antenna, the encoded partially demodulated second digital content signal.

The second processing system of the electronic device may be further configured to receive the encoded partially demodulated second digital content signal, decode the encoded partially demodulated second digital content signal to retrieve the partially demodulated second digital content signal, further demodulate the partially demodulated second digital content signal to retrieve the second digital content signal, and display the second video content on the display using the second digital content signal. Partially demodulating the second broadcast signal may include performing one or more first signal processing operations of a plurality of signal processing operations of a demodulation pipeline, and further demodulating the partially demodulated second digital content signal may include performing one or more second signal processing operations of the plurality of signal processing operations.

An accessory for use with an electronic device, may include a housing, an attachment mechanism coupled to the housing and configured to removably attach the accessory to an electronic device, a processing system within the housing, a first antenna operably coupled to the processing system and configured to receive a broadcast signal, the broadcast signal including video content, a second antenna operably coupled to the processing system and configured to communicate with the electronic device via a wireless communication protocol, wherein the processing system may be configured to receive the broadcast signal from the first antenna, partially demodulate the broadcast signal to produce a partially demodulated digital content signal, encode the partially demodulated digital content signal according to the wireless communication protocol to produce an encoded partially demodulated digital content signal, and send to the electronic device, via the second antenna, the encoded partially demodulated digital content signal.

The accessory may further include a battery, and a wireless charging system coupled to the battery, the wireless charging system configured to wirelessly receive power from the electronic device, and charge the battery using the power received from the electronic device. The attachment mechanism may include a magnetic mounting system including one or more magnets configured to magnetically couple the accessory to the electronic device.

The accessory may be an input accessory configured to provide a user input to the electronic device. The accessory may further include an input sensing system configured to detect a user input at the accessory, and the processing system may be further configured to, in response to detecting the user input, send an input signal, via the second antenna and using the wireless communication protocol, to the electronic device. The input sensing system may include at least one of an accelerometer configured to detect a tap input applied to the accessory, or a button configured to receive an actuation input.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1A:
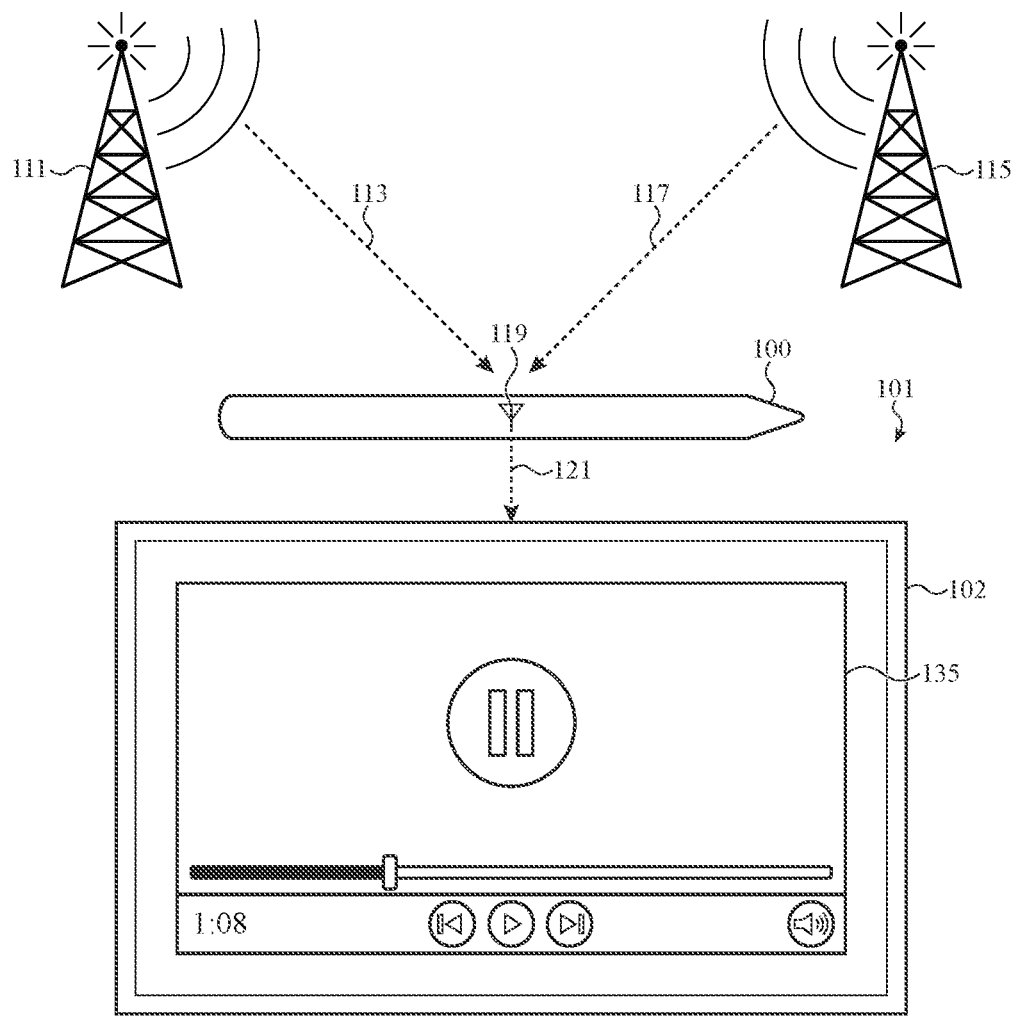
FIGS. 1A-1B depict an example electronic device system with an accessory and an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Described herein are accessories for electronic devices, and in particular accessories for electronic devices configured to receive and process broadcast television (TV) signals.

Electronic devices such as smartphones, tablets, and computers, may be invaluable for tasks such as retrieving information, coordinating actions, and generally communicating with others. However, these functions may be unavailable when cellular or other Internet connected networks are unavailable. Electronic devices have also become ubiquitous for consumption of audio, video, and other media in a convenient manner. These functions may also be unavailable when cellular or other Internet connected networks are unavailable. Moreover, due to the ubiquity of Internet-based, on-demand content delivery sources (e.g., streaming video), as well as the general trend towards smaller and lighter electronic devices, such devices may not be configured to receive and/or process broadcast content, such as broadcast TV signals.

Described herein are accessories that are configured to provide an accessory function to a remote electronic device, such as a tablet computer, and that are also configured to receive and process broadcast signals and wirelessly communicate the content from the broadcast signals to the remote electronic device. In this way, TV signal capture and processing operations may be provided by a device (e.g., an accessory device such as a stylus) that is separate from the electronic device on which the content is displayed (e.g., the tablet computer). Moreover, by providing the TV signal capture and processing functions in an accessory that also performs an accessory function for the electronic device, greater functionality may be provided to an electronic device without requiring additional accessories or components.

As one example, a tablet computer may be usable with an input accessory, such as a stylus. The stylus may be configured to provide inputs to the tablet computer, such as via contact with the screen of the tablet computer (e.g., writing, drawing, touching, or tapping on the screen). The stylus may also be configured to wirelessly communicate with the tablet computer to facilitate the accessory functions (e.g., via Bluetooth or another wireless communications protocol). For example, the stylus may receive inputs (e.g., a tap on the stylus housing or a press of an integrated button), and may send an input signal (e.g., an indication of the occurrence of the input) to the tablet computer using a wireless communication system. The tablet may perform an operation or take an action in response to receiving the indication of the input.

As described herein, the accessory may include an antenna for receiving broadcast signals, as well as a processing system that can process the broadcast signals to produce a digital content signal and send the digital content signal to the receiving electronic device. For example, the accessory may include an antenna that is tuned to receive broadcast signals. The accessory may include a processing system that receives the broadcast signals and performs one or more signal processing operations to convert the broadcast signal to a digital content signal that can be transmitted via the wireless communication system to a remote electronic device for display. In this way, the antenna and processing system for handling the broadcast signal can be provided in the accessory rather than in the displaying device, thereby simplifying the construction and operation of the displaying device. Further, providing such components and functionality in the accessory (which uses wireless communications for its accessory functionality) leverages common components and capabilities of the accessory for multiple functions.

In some cases, the accessory may be configured to process different broadcast signals differently, depending on the type of broadcast signal that is being received. In particular, different broadcast signals may be encoded according to different broadcast protocols, and each broadcast signal may require different signal processing and/or demodulation operations in order to produce a signal that can be effectively communicated to a remote device via the wireless communication system onboard the accessory. Moreover, in some cases, signal processing and demodulation functionality for a first type of broadcast signal may already exist on the remote electronic device, while signal processing and demodulation functionality for a second type of broadcast signal may not exist on the remote electronic device. For the first type of broadcast signals, the accessory may be configured to perform different signal processing operations (as compared to the second broadcast signals) so that the functionality already onboard the remote electronic device can be leveraged to perform some of the signal processing. In the case of the second type of broadcast signals, the accessory may be configured to perform additional or different signal processing operations such that a more fully processed content signal (e.g., in a playable video data format) can be provided to the remote electronic device.

As one particular example, an accessory, such as a stylus, may include one or more antennas that can receive broadcast signals encoded according to different broadcast protocols (e.g., an Advanced Television Systems Committee (ATSC) standards-based broadcast signal and a fifth generation (5G) standards-based broadcast signal). In some cases, the displaying device (e.g., a mobile phone or tablet computer) may not include processing systems that are configured to process ATSC broadcast signals, but it may include a 5G signal processing system (e.g., a 5G demodulator), which may be used by the displaying device for 5G wireless communications. Accordingly, for ATSC broadcast signals, the accessory may be configured to process (e.g., demodulate) the signals to produce a video signal that can be provided directly to a display system, while for 5G broadcast signals, the accessory may only partially demodulate the signal. The partially demodulated signal may be sent to the displaying device so that the existing 5G demodulation functionality onboard the displaying device can further process the signal to retrieve the video content for display. In this way, the accessory system described herein may efficiently leverage existing hardware and device functionality to provide numerous additional content delivery functions.

FIG. 1A depicts an example electronic device system 101 that includes an electronic device 102 and an accessory 100. The electronic device 102 includes a display 135 for displaying graphical outputs (e.g., video content, graphical user interfaces, etc.). The electronic device 102 may include a housing at least partially enclosing the display 135 (and/or other components), and a transparent cover (e.g., glass, plastic, glass-ceramic, ceramic, etc.) positioned over the display and defining a front exterior surface of the electronic device. As depicted in FIG. 1A, the electronic device (also referred to as a displaying device) is a tablet computer, though this is merely one example device. In other cases, the electronic device 102 may be a mobile phone, tablet computer, head-mounted display, laptop computer, smartwatch, or the like. Further, while FIG. 1A depicts the accessory 100 as a stylus, the accessory 100 may be a different accessory device such as an auxiliary battery, a keyboard, a mouse, a trackpad accessory, or the like.

As shown in FIG. 1A, the accessory 100 may include an antenna 119 for receiving first broadcast signals 113 from a first broadcast signal source 111 and second broadcast signals 117 from a second broadcast signal source 115. The first and second broadcast signals may be encoded in different broadcast protocols, and may each include video content (e.g., broadcast video content). For example, the first broadcast signals may be ATSC broadcast signals and the second broadcast signals may be 5G broadcast signals. The accessory 100 may process the broadcast signals according to a particular processing scheme for that type of broadcast signal, and may encode the processed signals according to a wireless communications protocol that is common to the accessory 100 and the device 102 (e.g., Bluetooth, WiFi, etc.). The accessory 100 may then send the processed signals 121 to the device 102 via the wireless communication protocol.

As described herein, the first broadcast signals may be processed differently from the second broadcast signals (by both the accessory 100 and the electronic device 102). In some cases, the first broadcast signals are processed (e.g., demodulated) by the accessory 100 to retrieve a digital content signal that corresponds to video content in a playable video format (e.g., a video data format), while the second broadcast signals are partially demodulated by the accessory 100 and the partially demodulated signal is sent to the device 102 for further processing and/or demodulation (e.g., to retrieve the video content in a playable video data format). Accordingly, in cases where the processed signal 121 includes video content in a video data format, the device 102 may decode the incoming signal and provide the video content to a display system for display on the display 135. In cases where the processed signal 121 includes a partially demodulated 5G broadcast signal (or other partially demodulated signal), the device 102 may decode the signal from the accessory 100 and provide the partially demodulated broadcast signal to a processing system for further demodulation and/or processing to retrieve video content in video data format (which is then provided to the display system for display).

Figure 1B:
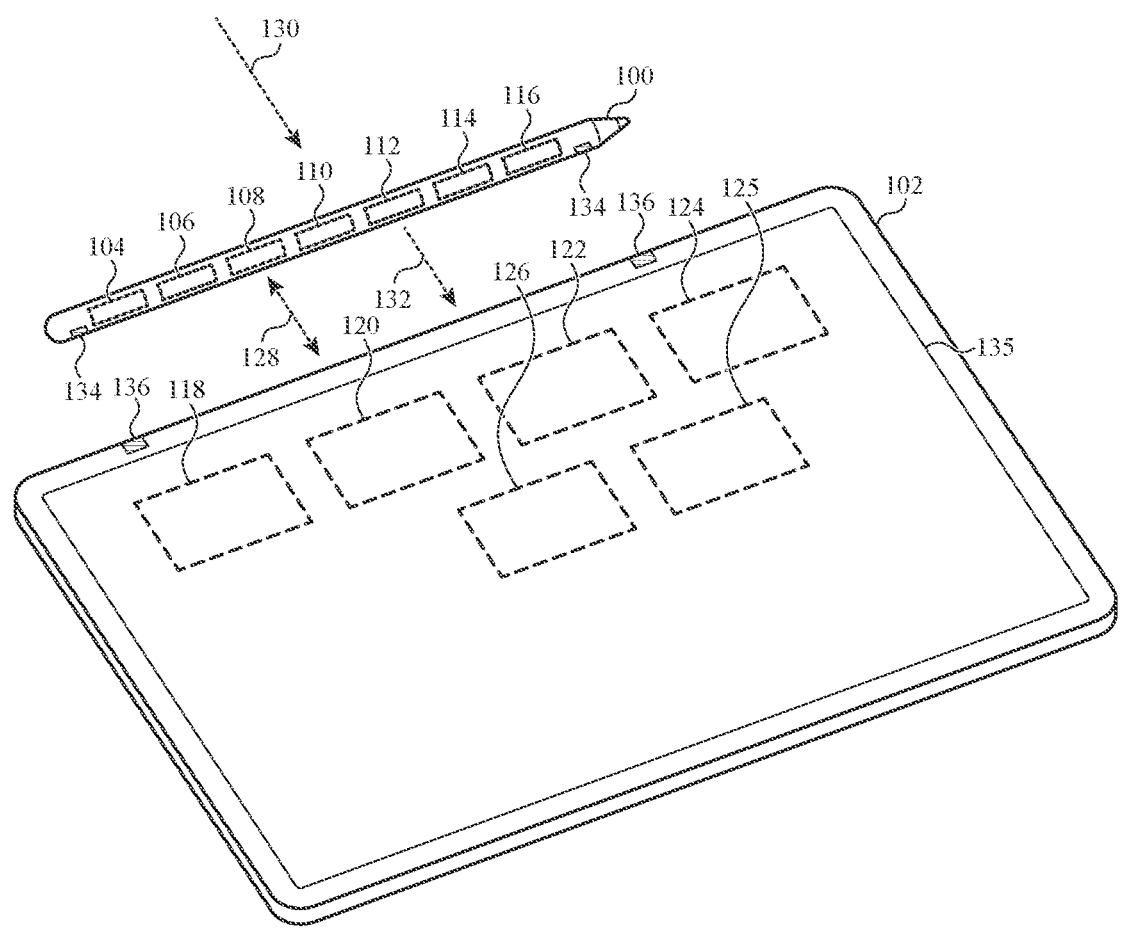

FIG. 1B shows the accessory 100 for an electronic device 102 according to one example. The accessory 100 may be a stylus configured to act as a user input for the electronic device 102, though the stylus depicted in FIG. 1B is merely for illustration, and the accessory 100 represents other types of accessories, as described herein. The electronic device 102 may be a tablet computing device, or another electronic device with a display (e.g., a laptop computer, mobile phone, desktop computer, etc.). The accessory 100 may include a memory 104, a processing system 106, communications system 108, broadcast signal processing system 110, one or more antennas 112, user input system 114, and a power source 116. The electronic device 102 may include a memory 118, a processing system 120, communications system 122, optional broadcast signal processing system 124, a display system 125, and a power source 126.

The accessory 100 may communicate with the electronic device 102 via the communications system 108 to perform an accessory function. In the case of the stylus shown in FIG. 1B, the accessory 100 may include an input sensing system configured to receive user input (e.g., by a user moving the accessory 100, actuating (e.g., pressing) a button on the accessory, tapping the accessory, touching the accessory to the device 102 (e.g., a tap, write, or swipe input on the display), or the like) and communicate with the electronic device 102 to provide the user input to the electronic device 102 (e.g., by sending an input signal to the electronic device 102). For example, the accessory 100 may communicate information such as a position of the accessory 100, an orientation of the accessory 100 relative to the electronic device 102, a pressure at a tip of the accessory 100, an occurrence or detection of an event at the accessory 100 (e.g., a detection of a tap, button press, touch or gesture input, movement of the accessory), or any other information. For purposes of illustration, FIG. 1B shows accessory communication signals 128 between the accessory 100 and the electronic device 102. The accessory communication signals 128 may be wireless communication signals such as Bluetooth signals, WiFi signals, proprietary wireless signals, optical signals, or any other type of wireless signals. The accessory communication signals 128 may be for the purposes of facilitating the accessory functionality of the accessory 100, and may not include video content.

In some cases, the accessory 100 may not communicate with the electronic device 102 to perform an accessory function, but rather may interact with the electronic device 102 in any manner to perform an accessory function. For example, the accessory 100 may be a passive stylus that does not communicate with the electronic device 102 via wireless communications to convey its position or otherwise provide input to the electronic device 102. Instead, a touch-sensitive surface (e.g., a touchscreen display, trackpad, or the like) on the electronic device 102 may detect the position and/or motion of the stylus on the electronic device 102. In such cases, accessory communication signals 128 may not be present. In general, accessories described herein may interact in various ways with an electronic device to perform their accessory functions.

In addition to performing an accessory function for the electronic device 102, the accessory 100 may also be configured to receive broadcast signals, such as Advanced Television Systems Committee (ATSC) standards-based broadcast signals or fifth generation (5G) standards-based broadcast signals. In some cases, the accessory 100 is configured to receive both ATSC and 5G broadcast signals.

For purposes of illustration, FIG. 1B shows broadcast signals 130 being received at the accessory 100. The broadcast signals 130 may be received at an antenna of the one or more antennas 112. The antenna for receiving the broadcast signals 130 may be tuned for receiving broadcast signals of a particular frequency range, such as between about 450 MHz and about 900 MHz. The antenna may be tuned for receiving ATSC and 5G broadcast signals.

The accessory 100 may process the received broadcast signals using the broadcast signal processing system 110. Processing the received broadcast signals using the broadcast signal processing system 110 may include different processing operations depending on the type of broadcast signal being processed. For example, in the case of a broadcast signal for which the receiving device (e.g., the device 102) does not include demodulation functionality, processing the broadcast signal may include demodulating the broadcast signal to produce a digital content signal that includes video content (e.g., TV content). The accessory 100 may then encode the digital content signal according to a wireless communication protocol to produce an encoded digital content signal (e.g., with the communications system 108). The wireless communication protocol may be a wireless communication protocol that is used by the accessory 100 and the device 102 to facilitate the accessory functionality. For example, the accessory 100 and the device 102 may use Bluetooth communications to facilitate the accessory functionality of the accessory 100. Accordingly, the accessory 100 may encode the digital content signal (e.g., video content in a playable video format) according to the Bluetooth protocol, and transmit the encoded digital content signal to the device 102 (e.g., encoded content signals 132). Upon receiving the encoded digital content signal, the device 102 may decode the signal (e.g., decode the Bluetooth signal) to retrieve the digital content signal, and provide the digital content signal (which may be or may correspond to a playable video format) to a display system 125, which causes the video content to be displayed on the display 135. The display system 125 may be configured to receive digital content signals in a playable video format (e.g., a digital content signal encoded in a video format, such as H.264, H.265, MPEG-2, or another suitable format), and cause the video content to be displayed on the display 135.

In the case of a broadcast signal for which the device 102 includes demodulation functionality (but may not include an antenna for receiving the broadcast signal), the accessory 100 may process the received broadcast signal differently than for a broadcast signal for which the device 102 does not include or is not configured with demodulation functionality. For example, processing the broadcast signal may include partially demodulating the broadcast signal to produce a partially demodulated digital content signal that includes the video content (e.g., TV content) of the broadcast signal. The accessory 100 may then encode the partially demodulated digital content signal according to the wireless communication protocol to produce an encoded partially demodulated digital content signal (e.g., with the communications system 108) and send the encoded partially demodulated digital content signal (e.g., encoded content signals 132) to the device 102.

Upon receiving the encoded partially demodulated digital content signal, the device 102 may decode the partially demodulated digital content signal and provide the partially demodulated digital content signal to its onboard broadcast signal processing system 124 (which may be used for 5G voice and data communications received at the device 102 over a different frequency range than the 5G broadcast signals, for example). The broadcast signal processing system 124 may perform additional demodulation and/or signal processing operations to retrieve or generate, from the partially demodulated digital content signal, a digital content signal in a playable video format. The digital content signal may then be provided to the display system 125, which causes the video content to be displayed on the display 135.

The foregoing examples illustrate how different types of broadcast signals may be processed differently by an electronic device system that includes an accessory device and a display device. In particular, this technique yields a highly efficient system for displaying multiple types of broadcast TV on an electronic device.

While the foregoing example describes that the encoded content signals 132 are encoded and transmitted according to a Bluetooth protocol, other types of encoding and transmission protocols or techniques may be used, including WiFi protocols, proprietary wireless protocols, optical protocols, or any other type of wireless data transmission protocol.

While shown separately in FIG. 1B, the accessory communication signals 128 and the encoded content signals 132 may be sent over the same communications channel between the accessory 100 and the electronic device 102. For example, the accessory communication signals 128 and the encoded content signals 132 may be sent over the same Bluetooth connection between the accessory 100 and the electronic device 102. In other cases, the accessory communication signals 128 may be sent over a different communication channel and/or using a different communication protocol than the encoded content signals 132 (e.g., signals 128 may be sent via Bluetooth and signals 132 may be sent via WiFi). The accessory communication signals 128 may be sent concurrently with the encoded content signals 132, or each may be sent in a serial fashion.

The accessory 100 may include a magnetic attachment mechanism comprising one or more magnets 134, which are configured to interface with one or more magnets 136 on the electronic device 102 for magnetically attaching the accessory 100 to the electronic device 102 (e.g., such that the accessory 100 may be selectively magnetically coupled to the device 102). While the accessory 100 in FIG. 1B is shown as a stylus and the electronic device 102 as a tablet, the principles of the present disclosure may equally apply to other accessory and device combinations, as described herein. The magnetic attachment mechanism may include or be associated with a wireless charging or wireless power transfer system that is configured to wirelessly transfer power between the accessory 100 and the device 102. For example, the accessory 100 may include a conductive coil and the device 102 may include a conductive coil, and the conductive coils may inductively or otherwise wirelessly couple to transfer power. Power may be transferred from the device 102 to the accessory 100, or vise versa. Where the accessory wirelessly receives power from the device 102, the accessory may use the power to charge a battery onboard the accessory 100.

Figure 2:
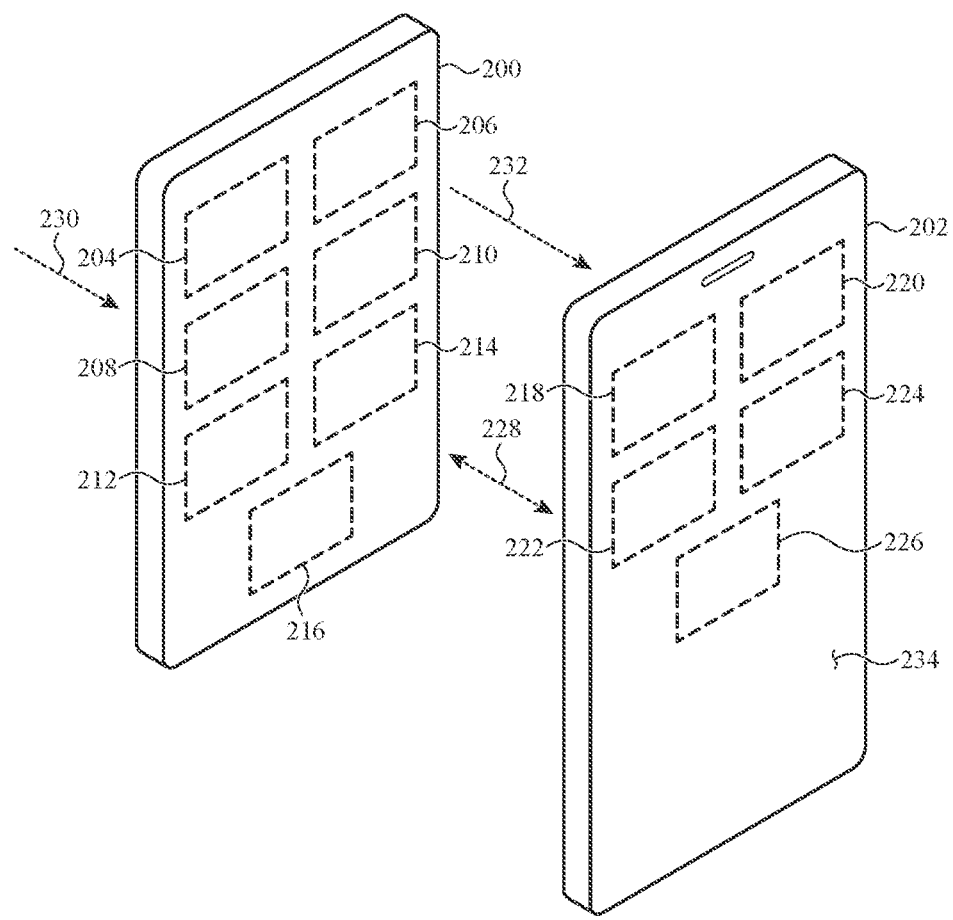
FIG. 2 depicts another example electronic device system with an accessory and an electronic device.

FIG. 2 shows an accessory 200 for an electronic device 202 according to an additional example. The accessory 200 may be a power bank (e.g., a supplemental battery pack) configured to provide power to the electronic device 202 to charge a battery thereof (e.g., via a wireless power transfer system, as described above). The electronic device 202 may be a smartphone device. The accessory 200 may include a memory 204, a processing system 206, communications system 208, broadcast signal processing system 210, one or more antennas 212, user input system 214, and a power source 216. The electronic device 202 may include a memory 218, a processing system 220, communications system 222, optional broadcast signal processing system 224, a display system 225, and a power source 226.

The accessory 200 may communicate with the electronic device 202 via the communications system 208 to perform an accessory function. In the case of the power bank shown in FIG. 2, the accessory 200 may communicate a remaining charge of a battery of the power bank to the electronic device 202, which may display or otherwise utilize the data indicating the remaining charge of the power bank. The accessory 200 may communicate additional information such as received user inputs (e.g., a user moving the accessory 200, a user interacting with a button of the accessory 200, etc.). For purposes of illustration, FIG. 2 shows accessory communication signals 228 between the accessory 200 and the electronic device 202. The accessory communication signals 228 may be wireless communication signals such as Bluetooth signals.

As discussed above, the accessory 200 need not communicate with the electronic device 202 to perform an accessory function. For example, the accessory 200 may provide power to the electronic device 202 without communicating any information therewith to perform the accessory function. In such cases, the accessory communication signals 228 may be omitted.

In addition to performing an accessory function for the electronic device 202, the accessory 200 may also be configured to receive broadcast signals 230, such as ATSC standards-based broadcast signals or 5G standards-based broadcast signals. The accessory 200 may process the received broadcast signals using the broadcast signal processing system 210 (which may operate in the same or similar manner as the broadcast signal processing system 110), and may then encode the digital content signal according to a wireless communication protocol to produce an encoded digital content signal (e.g., with the communications system 208). The accessory 200 may encode the digital content signal (e.g., video content in a playable video format) according to the wireless communication protocol, and transmit the encoded digital content signal to the device 202 (e.g., encoded content signals 232). Upon receiving the encoded digital content signal, the device 202 may decode the signal (e.g., decode the Bluetooth signal) to retrieve the digital content signal, and provide the digital content signal (which may be or may correspond to a playable video format) to a display system 225 for output on a display.

The accessory 200 and the electronic device 202 may operate in a manner that is generally consistent with the description of the accessory 100 and device 102 of FIGS. 1A-1B, and the description of the accessory 100 and the device 102 will be understood to apply to the accessory 200 and device 202 (and their corresponding modules, systems, circuitry, components, etc.).

Figure 3A:
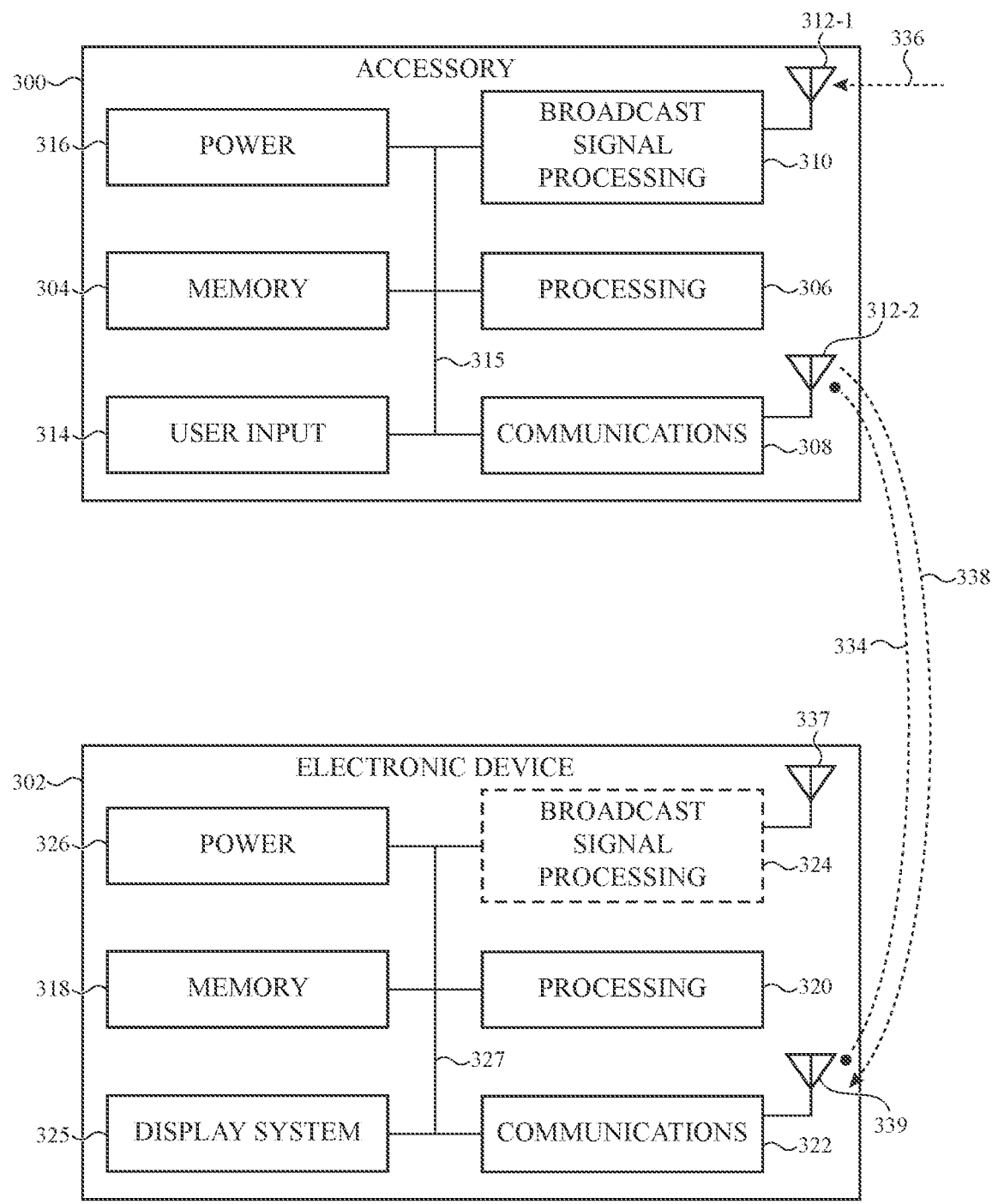
FIG. 3A depicts a simplified block diagram of an example accessory and electronic device.

FIG. 3A is a simplified electronic block diagram illustrating exemplary components and/or systems of an accessory 300 and electronic device 302. The accessory 300 may correspond to the accessories 100, 200 described above, or other types of accessories as described herein. The electronic device 302 may correspond to the electronic devices 102, 202 described above, or other types of electronic devices as described herein.

The accessory 300 may include a memory 304, a processing system 306, communications system 308, broadcast signal processing system 310, one or more antennas 312 (e.g., antennas 312-1, 312-2), user input system 314, and a power source 316, which may be communicably or otherwise coupled via a bus 315. These components of the accessory 300 may correspond to the similarly named components of the accessories 100, 200, and the descriptions and functions of those components also apply to those of the accessory 300.

Further, as shown in FIG. 3, the one or more antennas 312 may include a first antenna 312-1, which may be a broadcast antenna configured to receive broadcast signals, such as ATSC and 5G broadcast signals. In some cases, the same broadcast antenna 312-1 is used for multiple types of broadcast signals (e.g., ATSC and 5G), while in other cases, multiple broadcast antennas are provided in order to receive broadcast signals via multiple different sources, frequencies, and/or wavelengths. In some cases, the antenna 312-1 is configured to receive broadcast signals in the 700 MHz frequency band, 600 MHz frequency band, between about 450 MHz and about 900 MHz, or any other suitable frequency band. Example configurations of broadcast antennas are described herein with respect to FIGS. 4A-4F. The second antenna 312-2 may be configured to communicate with the device 302 via a wireless communication protocol, such as Bluetooth, WiFi, etc., and may communicate at a 2.4 GHz frequency band, or any other suitable frequency band. The accessory 300 may receive broadcast signals 336 via the first antenna 312-1, and send accessory communication signals 334 and encoded digital content signals 338 to the device 302 via the second antenna 312-2, as described.

The electronic device 302 may include a memory 318, a processing system 320, communications system 322, optional broadcast signal processing system 324, a display system 325, and a power source 326, which may be communicably or otherwise coupled via a bus 327. These components of the device 302 may correspond to the similarly named components of the devices 102, 202, and the descriptions and functions of those components also apply to those of the device 302. The device 302 may also include antennas, such as antenna 339 and antenna 337.

As described herein, the device 302 may receive, via the antenna 339, accessory signals 334 and encoded digital content signals 338 from the accessory 300. The device 302 may perform one or more actions in response to receiving the accessory signal 334, such as changing a graphical output on a display, changing a device parameter, changing a mode of operation of the device, or the like. In response to receiving the encoded digital content signals 338, the device 302 may perform various operations (which may differ based on the type of encoded digital content signal received) that ultimately cause the device to display video content that is included in the content signals. Example operations relating to the receipt and processing of the content signals are described herein, such as with respect to FIGS. 1A-1B and 3B. The antenna 339 may be configured to communicate with the accessory 300 via a wireless communication protocol, such as Bluetooth, WiFi, etc., and may communicate at a 2.4 GHz frequency band, or any other suitable frequency band.

The antenna 337 may be configured to receive 5G data signals (e.g., 5G cellular communications), to provide voice, data, and/or other communications functionality to the device 302. The received 5G data signals may be processed by the same components and/or systems (or portions thereof) that perform the broadcast signal processing functions. For example, the device 302 may include a 5G wireless communications processing system (e.g., as part of the communications system 322), which may include a modem and/or other suitable components to receive and decode received 5G systems. As noted above, however, while the antenna 337 may be configured (e.g., tuned) to receive some 5G data signals, the antenna 337 may not be configured to receive 5G broadcast signals. However, as partially demodulated 5G broadcast signals may be provided to the device 302 via the accessory 300, as described herein, the same systems that provide 5G signal processing functionality for the 5G data signals may also be used to further demodulate the 5G broadcast signals. In FIG. 3A, the broadcast signal processing system 324 is shown as a distinct module or entity, though it will be understood that the broadcast signal processing system 324 may be instantiated by any systems or resources of the device 302, and that components, circuitry, processors, resources, or the like, may be shared among multiple systems (e.g., used to instantiate multiple systems). Thus, for example, the communications system 322 may include processors, modems, circuitry, and the like, that facilitate multiple device communications, including sending and receiving Bluetooth signals, WiFi signals, 5G data signals, and/or other types of wireless signals, and may facilitate the processing of partially demodulated broadcast signals (e.g., it may instantiate the broadcast signal processing system 324).

The accessory 300 may communicate with the electronic device 302 via the communications systems 308, 322 to perform an accessory function. For example, as discussed above, the accessory 300 may communicate with the electronic device 302 to act as a stylus for the electronic device, to act as a power bank for the electronic device, or to perform any other function for adding to or augmenting the functionality of the electronic device 302. For example, the accessory 300 may be a charging dock or charging accessory, a magnetically attachable wallet accessory (e.g., which may include a magnetic attachment mechanism), a device case, an external speaker accessory, or the like. Communications between the accessory 300 and the electronic device 302 may include various types of communications, including communications from the accessory 300 to the device 302 (e.g., sending information about button presses or other inputs received at the accessory 300 to the device 302, sending information identifying the accessory 300 to the device 302) or from the device 302 to the accessory 300 (e.g., in the case of an external speaker accessory, sending audio content from the device 302 to the accessory 300). The electronic device 302 may be a smartphone, a tablet, a computer, or any other electronic device.

As described herein, the accessory 300 need not communicate with the electronic device 302 to provide an accessory function. For example, the accessory 300 may be a passive stylus that does not actively communicate positioning information to the electronic device 302. As another example, the accessory 300 may be a magnetically attachable wallet that provides an accessory function without communicating with the device 302 (though in some cases a magnetically attachable wallet may communicate with the device 302, such as to identify itself to the device 302). Further, in some cases, an accessory function is facilitated by the accessory 300 receiving data or information from the electronic device 302, such as an external speaker accessory receiving an audio stream from the electronic device 302.

In various examples provided herein, an electronic device system includes an accessory with an antenna for receiving broadcast signals and a processing system for processing the broadcast signals, and a display device that receives digital content signals in one of multiple stages of signal processing (e.g., fully demodulated broadcast signals or partially demodulated broadcast signals). In described examples, the display device includes native 5G signal processing systems for onboard data communications, but does not include an antenna for receiving 5G broadcast signals. Because the display device has onboard 5G signal processing systems, the accessory does not need to have a complete 5G processing system onboard, as the 5G processing systems of the display device can be leveraged to provide the necessary signal processing. On the other hand, the display device may not have processing systems to demodulate or otherwise process ATSC or other broadcast signals, and as such the processing systems may be incorporated into the accessory. While ATSC broadcast and 5G broadcast signals are used as example signals, it will be understood that the concepts are not limited to these particular types of broadcast signals. For example, the principles described herein can likewise apply to other types of signals for which the accessory and the electronic device have different sets of capabilities, such that different signal processing pipelines and allocations of resources between the accessory and display device may be used for different signals. More particularly, where a display device lacks signal processing functionality for a first type of broadcast signal, the accessory may perform all or substantially all of the signal processing of the first broadcast signal (e.g., to produce a playable video format), and where the display device includes signal processing functionality for a second type of signal, the accessory may perform a first portion of the signal processing and the display device may perform a second portion of the signal processing. Other types of broadcast signals that an accessory and device may be configured to receive, process, and display include DVB-T broadcast signals, ISDB-T broadcast signals, NTSC standards-based signals, or other TV broadcast signals.

Figure 3B:
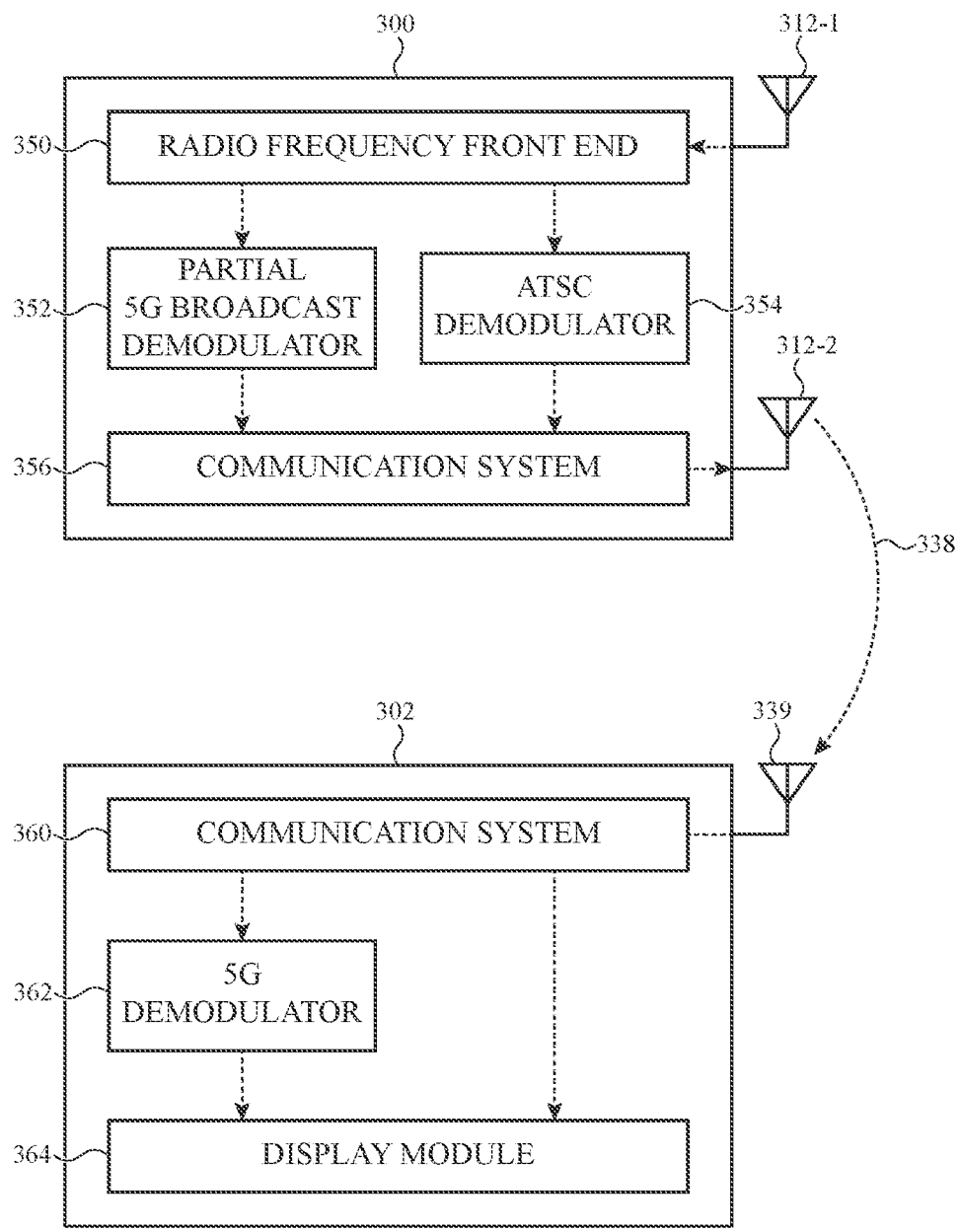
FIG. 3B depicts example signal processing pipelines for broadcast signals received by an electronic device system.

FIG. 3B illustrates example signal processing pipelines for two different types of broadcast signals in an electronic device system with the accessory 300 and the device 302. While the example relates to ATSC and 5G broadcast signals, it will be understood that similar processing pipelines may be employed for other types of broadcast signals.

A first signal processing pipeline for a first broadcast signal that includes video content (e.g., an ATSC broadcast signal) may begin when the first broadcast signal is received at the antenna 312-1 of the accessory. The first broadcast signal may be processed by a radio frequency front end 350, and the output (e.g., a baseband signal) may be provided to a first demodulator 354 (e.g., an ATSC broadcast demodulator). The first demodulator may demodulate the broadcast signal to produce a digital content signal including the video content. The digital content signal may then be provided to a communications system 356. The communications system 356 may receive the digital content signal from the processing system, encode the digital content signal according to a wireless communication protocol to produce an encoded digital content signal, and send the encoded digital content signal to the electronic device 302 via the antenna 312-2. As noted above, the wireless communication protocol may be the same protocol that is used to communicate accessory signals between the accessory 300 and the device 302 (e.g., Bluetooth, WiFi, etc.).

In this example, the device 302 may lack a demodulator that is configured to demodulate (or capable of demodulating) the first broadcast signal. Accordingly, the first demodulator 354 may demodulate the signal to produce video content in a playable video format, such as an H.264 format, MPEG-2 format, or the like. The video content in the playable video format may be encoded by the communications system 356 for transmission to the device 302.

In response to receiving the encoded digital content signal from the accessory 300, the device 302 may decode the encoded digital content signal to retrieve the digital content signal (e.g., the video content in a playable video format). The device 302 may determine whether the decoded signal is video content in a playable video format, or whether it is a partially demodulated signal that requires further demodulation. In some examples, the device 302 may analyze the signal for this determination. In other examples, the encoded digital content signal may include an indication of the type of signal that is encoded and/or what additional processing operations, if any, are required in order to produce video content in a playable video format. In response to determining that the decoded signal is video content in a playable video format, the decoded signal may be provided to a display system 364 of the device 302, which causes the video content to be rendered on a display.

As described, a second signal processing pipeline may be used for a second broadcast signal (e.g., a 5G broadcast signal) that is encoded differently than the first broadcast signal (and for which the device 302 includes demodulation or other signal processing functionality). The second signal processing pipeline may begin when the second broadcast signal is received at the antenna 312-1 of the accessory. The second broadcast signal may be processed by the radio frequency front end 350, and the output (e.g., a baseband signal) may be provided to a second demodulator 352 (e.g., a 5G broadcast demodulator). The second demodulator may partially demodulate the broadcast signal to produce a partially demodulated digital content signal. In some cases, the partial demodulation includes only a subset of the demodulation operations (of a demodulation workflow) that are necessary in order to convert the baseband signal to video content in a playable video format. The partial demodulation operations may be configured to produce a signal that can be encoded according to the common wireless communication protocol of the accessory 300 and the device 302 (e.g., Bluetooth, WiFi), and allows the accessory 300 to include only partial demodulation functionality (rather than a more complete broadcast demodulator, which may increase expense, size, complexity, etc., of the accessory 300). Moreover, since a suitable demodulator is present in the device 302, the accessory 300 may be configured with only minimal demodulation capability (e.g., sufficient demodulation to produce a signal that can be encoded, as described).

After partial demodulation, the partially demodulated digital content signal may be provided to the communications system 356, which receives the partially demodulated digital content signal, encodes the partially demodulated digital content signal according to a wireless communication protocol to produce an encoded partially demodulated digital content signal, and sends the encoded partially demodulated digital content signal to the electronic device 302 via the antenna 312-2. As noted above, the wireless communication protocol may be the same protocol that is used to communicate accessory signals between the accessory 300 and the device 302 (e.g., Bluetooth, WiFi, etc.).

In response to receiving the encoded partially demodulated digital content signal from the accessory 300, the device 302 may decode the encoded partially demodulated digital content signal to retrieve the partially demodulated digital content signal. As noted above, the device 302 may determine whether the decoded signal is video content in a playable video format, or whether it is a partially demodulated signal that requires further demodulation. In response to determining that the decoded signal is a partially demodulated digital content signal, the decoded signal may be provided to a demodulator 362. The demodulator 362 may be configured to demodulate signals that are encoded according to a particular protocol, such as a 5G protocol. The demodulator 362 may be used to demodulate 5G voice and data signals, as well as partially demodulated digital content signals from an accessory. The demodulator 362 may complete the demodulation operations for the digital content signal in order to produce video content in a playable video format (e.g., H.265, MPEG-2, etc.), and provide the playable video content to the display system 364 of the device 302, which causes the video content to be rendered on a display. In some cases, the demodulator 362 only performs a portion of the demodulation and/or other signal processing operations that are necessary in order to retrieve or obtain video content in a playable video format (because the signal was already partially demodulated by the accessory 300).

Thus, as shown in FIG. 3B, the signal processing pipeline for different types of broadcast signals, in an electronic device system, may differ based on the type of broadcast signal and the particular types of processing capabilities or functionalities of the devices.

ATSC and 5G standards-based broadcast TV signals may be relatively low-frequency signals, in the range of 470 MHz to 862 MHz, having a channel bandwidth of 6, 7, or 8 MHz. Accordingly, to receive broadcast signals with a desired fidelity, a broadcast antenna is often limited in a minimum dimension. That is, a broadcast antenna might be constrained to a minimum length for providing a desired signal quality. Since the space inside most modern electronic devices is at a premium, being occupied by essential components such as batteries, displays, processors, memory and storage, and the like, it may be difficult or costly to fit a broadcast antenna into an electronic device. Accessories for electronic devices may be relatively simple compared to the electronic devices they interface with (and/or may have more available space for supplemental antennas), and thus may have a lower complexity barrier for the integration of a broadcast antenna compared to an electronic device. Accessories may also generally allow greater packaging options and flexibility for incorporating a broadcast antenna.

FIGS. 4A-4F each show an accessory 400 including an antenna 402 for receiving broadcast signals, according to various examples. The antenna 402 may be configured to receive broadcast signals in the range of 470 MHz to 862 MHz, having a channel bandwidth of 6, 7, or 8 MHz. In some cases, the antenna 402 is configured to receive a first broadcast signal in the range of 470 MHz to 862 MHz, having a channel bandwidth of 6 MHz, and a second broadcast signal in the range of 612 MHz to 652 MHz having a channel bandwidth of 6, 7, or 8 MHz. In some cases, the second broadcast signal may be in the range of 470 MHz to 698 MHz. The same antenna 402 may be used to receive both broadcast signals, or an accessory may include separate antennas for different broadcast signals.

The antenna 402 may be formed from or include a conductive (e.g., metal) member. Example conductive members include wires, conductive traces on circuit substrates (e.g., flexible circuit boards), metal strips, and the like. In some cases, an antenna may be defined by a portion of a housing component of the accessory 400, such as a metal or conductive member that defines a portion of the housing. In some cases, a slot antenna or other radio-frequency tuned structure may be defined by the housing of the accessory 400 itself.

As shown, the accessory 400 has a form factor representing a stylus and includes a tip end 404, which is used to interact with an electronic accessory (typically the pointed end), a cap end 406 opposite the tip end 404, and a housing 408 between the tip end 404 and the cap end 406. The housing 408 may provide a generally circular perimeter, such that a cross-section thereof is generally circular or generally cylindrical (though the exact shapes of the exterior and the internal cavity need not be exactly cylindrical). Notably, the principles discussed with respect to FIGS. 4A-4F can be applied to accessories having any form factor.

Figure 4A:
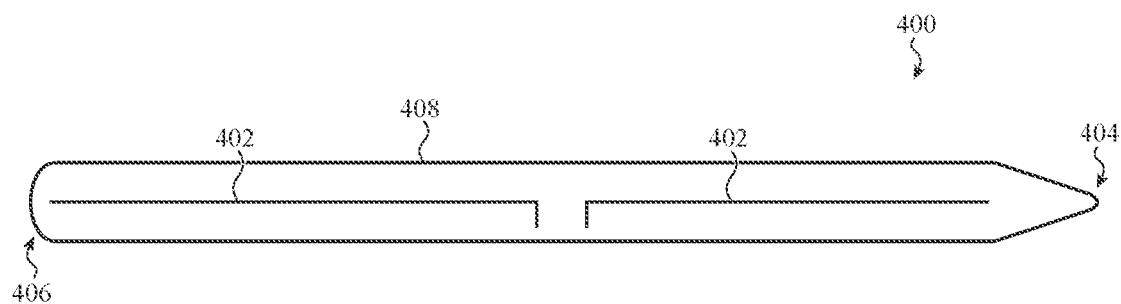
FIGS. 4A-4F depict various configurations for a broadcast antenna for an accessory for an electronic device.

FIG. 4A shows the antenna 402 as a dipole antenna extending across a length of the accessory 400 between the tip end 404 and the cap end 406. Providing a dipole antenna along a length of a stylus may ensure adequate length of the antenna for receiving broadcast signals with a desired signal quality.

Figure 4B:
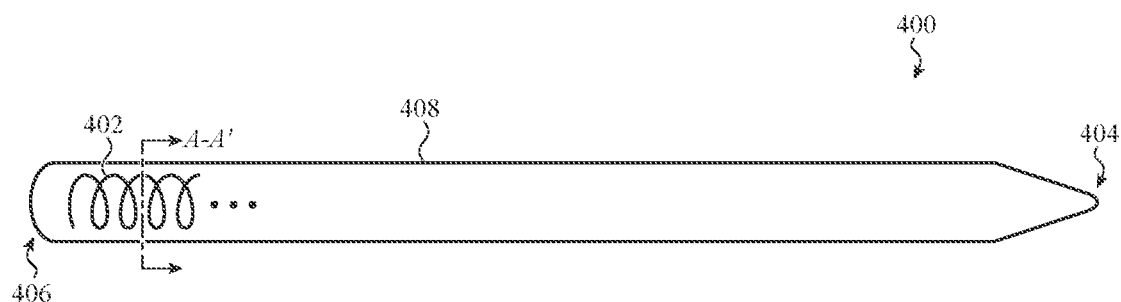
Figure 4C:
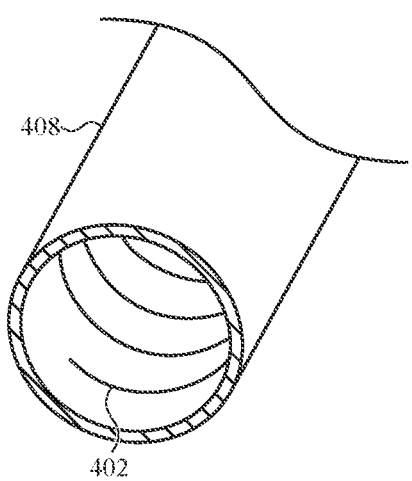

FIGS. 4B-4C show the antenna 402 provided in a spiral pattern around an internal cavity (of the housing 408) having a circular perimeter. The antenna 402 extends along at least a portion of a length of the internal cavity between the tip end 404 and the cap end 406. The antenna 402 in FIG. 4B may provide additional length, which may improve signal quality or otherwise allow for receiving broadcast signals with a desired quality. FIG. 4C shows a cross-sectional view through A-A' of FIG. 4B. As shown, the antenna 402 spirals along an internal cavity of the accessory 400.

Figure 4D:
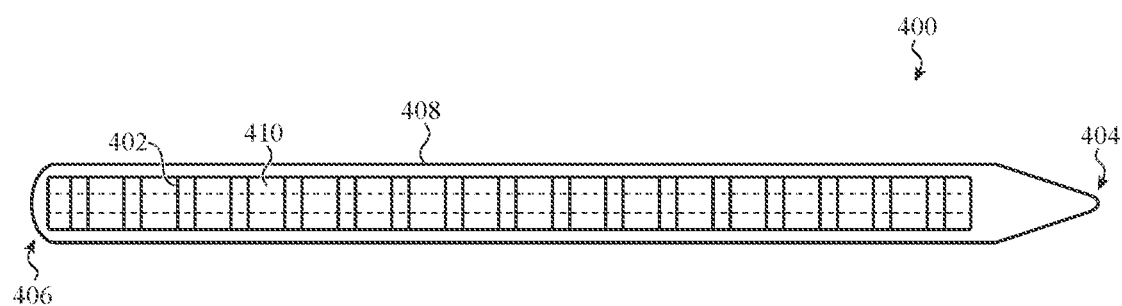
Figure 4E:
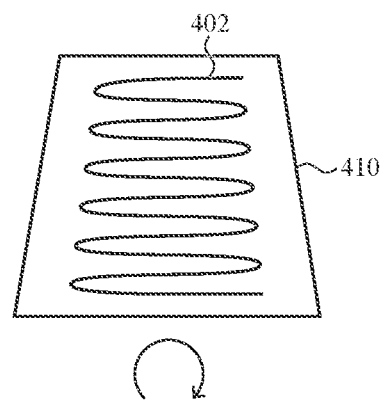
Figure 4F:
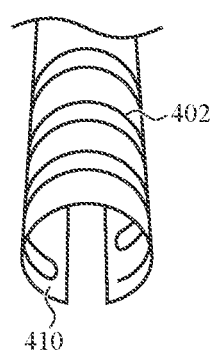

FIGS. 4D-4F show the antenna 402 provided in a serpentine pattern along a length of the housing 408 between the tip end 404 and the cap end 406 and wrapped along a circular perimeter of the housing 408. In particular, the antenna 402 may be provided as a conductive trace on a flexible substrate 410 in a serpentine pattern. The substrate 410 may then be rolled into a tube-like structure and inserted into an internal cavity of the housing 408. FIG. 4E shows the antenna 402 on the flexible substrate 410 in a flat configuration. FIG. 4F shows the antenna 402 on the flexible substrate 410 being rolled in preparation to be placed into an internal cavity of the housing 408. This design may provide additional length that may improve signal quality or otherwise allow for receiving broadcast signals with a desired quality. Notably, the designs for the antenna 402 shown in FIGS. 4A-4F are merely exemplary, and are not intended to limit the scope of the present disclosure in any way. Moreover, other antenna configurations other than those shown in FIGS. 4A-4F may be integrated with the accessory 400 to facilitate receiving broadcast signals.

Figure 5:
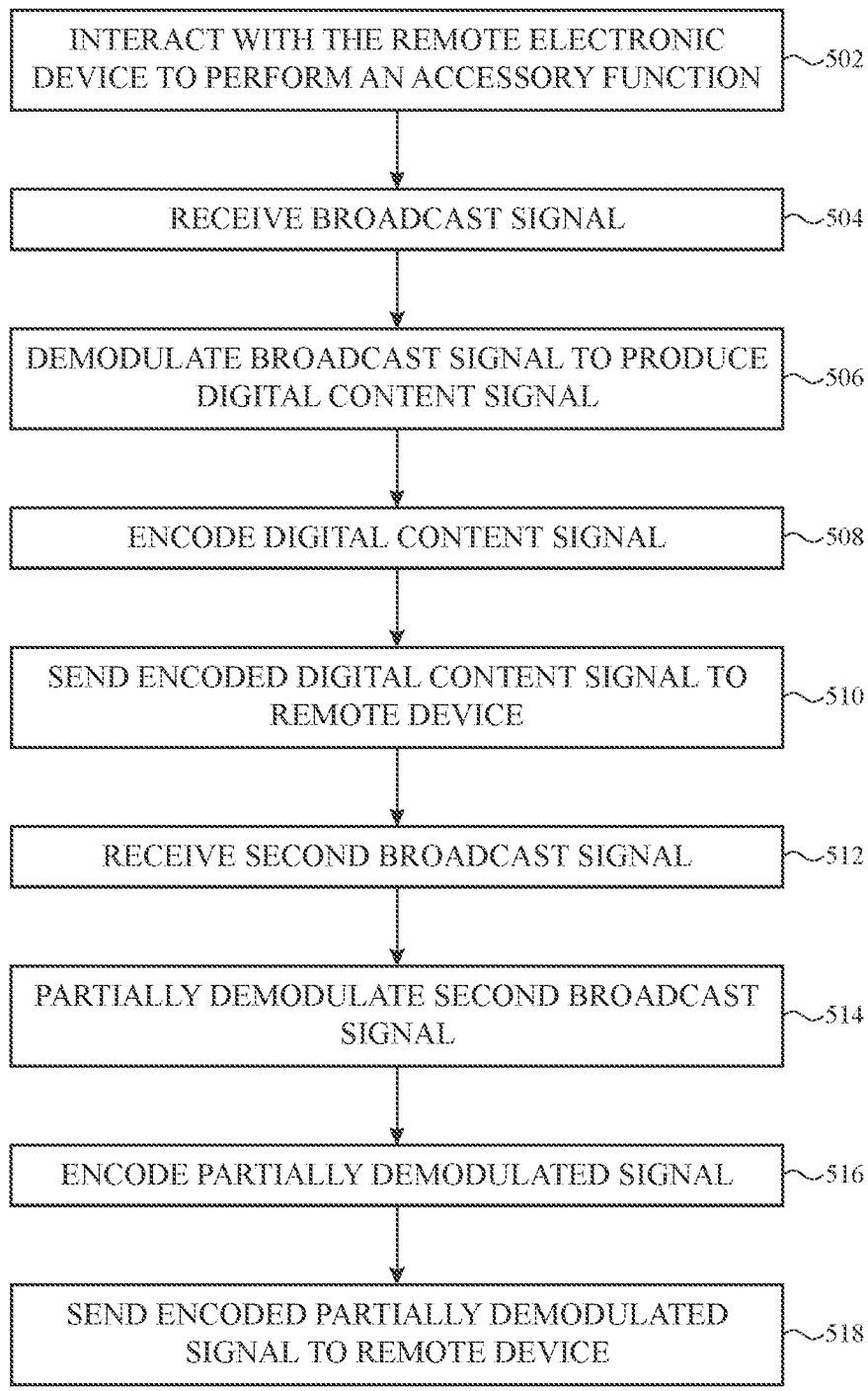
FIG. 5 is a flowchart depicting example operations of a method of operating an accessory for an electronic device, such as described herein.

FIG. 5 is a flow diagram illustrating a method 500 for operating an accessory for an electronic device. The accessory may be a stylus (or another type of accessory as described herein), and the electronic device may be a remote electronic device that is configured to communicate with the accessory to receive accessory inputs or otherwise facilitate the accessory functionality. In the example where the accessory is a stylus, the stylus may include a stylus body, a battery within the stylus body, a first antenna configured to receive one or more broadcast signals, a second antenna configured to communicate with the remote electronic device via wireless communication protocol, and a processing system.

At operation 502, the accessory may interact with the remote electronic device to perform an accessory function. For example, the accessory may send, via the second antenna and according to a shared wireless communication protocol, information about an input received at the accessory. As another example, the accessory may be used to provide writing, drawing, or other stylus-type inputs to the remote electronic device.

At operation 504, a broadcast signal may be received by the antenna. The broadcast signal may include video content, such as broadcast TV content. The broadcast signal may be broadcast on a first frequency band, and may be encoded according to a first broadcast protocol (e.g., ATSC broadcast protocol).

At operation 506, the broadcast signal may be demodulated to produce a digital content signal including the video content. Demodulating the broadcast signal may include demodulating the broadcast signal to produce video content in a playable video format (e.g., MPEG-2, H.264, or another suitable format).

At operation 508, the digital content signal is encoded (e.g., by a communication system within the accessory) according to the wireless communication protocol to produce an encoded digital content signal. The wireless communication protocol may correspond to the same wireless communication protocol used by the accessory and the remote electronic device for accessory function communications. Example protocols include Bluetooth, WiFi, or the like.

At operation 510, the encoded digital content signal is sent to the remote electronic device (e.g., via the second antenna of the accessory).

In some cases, the accessory is configured to receive and process a single type of broadcast signal. In some cases, the accessory is configured to receive and process multiple types of broadcast signals that are encoded according to different broadcast protocols. In such cases, the method 500 may further include additional operations including, at operation 512, receiving, via the antenna, a second broadcast signal encoded according to a second broadcast protocol different from the first broadcast protocol of the first broadcast signal (e.g., 5G broadcast protocol). The second broadcast signal may be broadcast on a same or a different frequency band as the first broadcast signal.

At operation 514, the second broadcast signal is partially demodulated to produce a partially demodulated second digital content signal. Partially demodulating the second digital content signal may include performing one or more first signal processing operation of a plurality of signal processing operations of a demodulation pipeline.

At operation 516, the partially demodulated second digital content signal is encoded according to the wireless communication protocol to produce an encoded partially demodulated second digital content signal.

At operation 518, the encoded partially demodulated second digital content signal is sent to the remote electronic device, via the second antenna.

Figure 6:
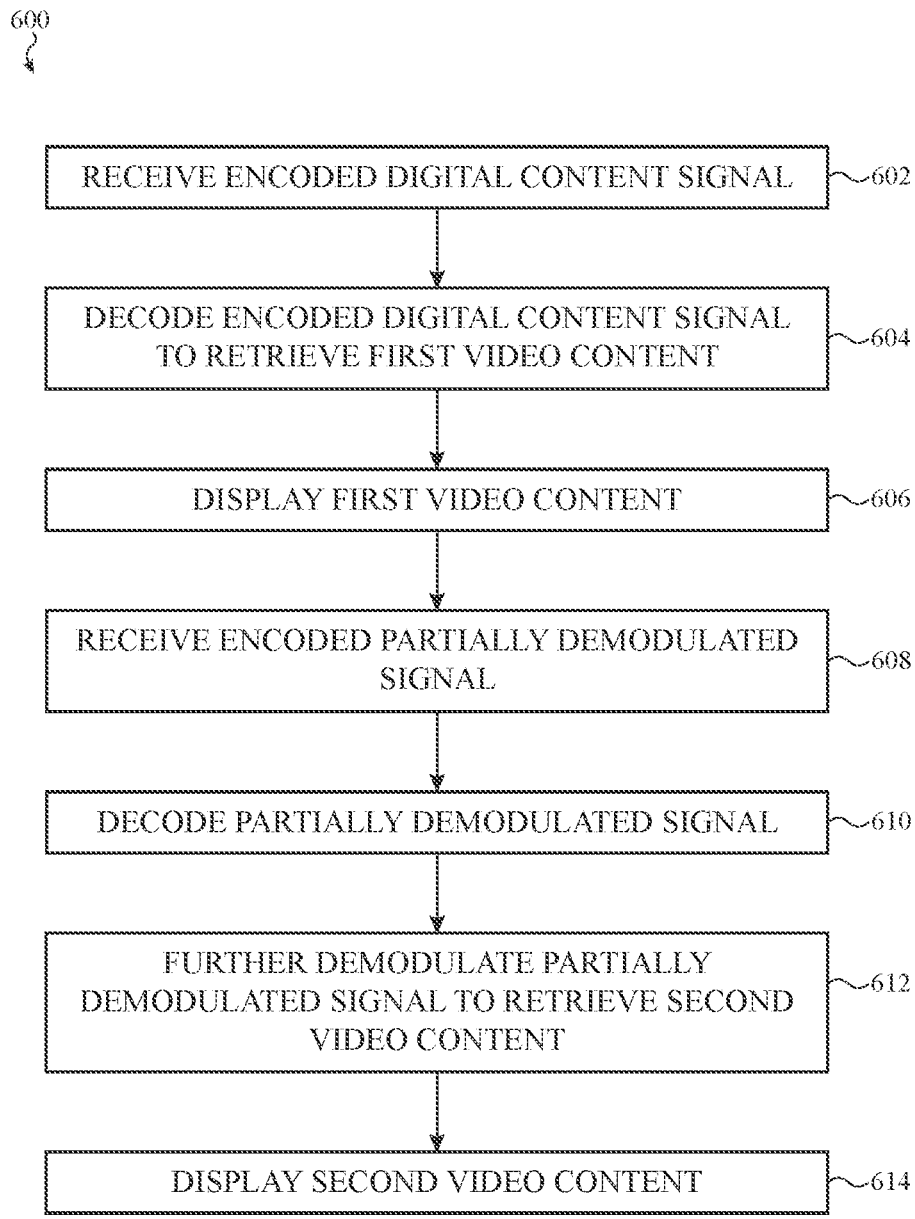
FIG. 6 is a flowchart depicting example operations of a method of operating an electronic device, such as described herein.

FIG. 6 is a flow diagram illustrating a method 600 for operating a remote electronic device that receives encoded digital content signals from an accessory. The remote electronic device may include an antenna for receiving accessory input signals or for otherwise communicating with an accessory device via the wireless communication protocol (e.g., Bluetooth, WiFi). The remote electronic device may also include a display and a display system that is configured to receive video content in a playable video format (e.g., MPEG-2, H.264, etc.) and display the video content on the display. The remote electronic device may also include a demodulating system that is configured to demodulate certain types of wireless signals, such as 5G voice and data signals.

At operation 602, the remote electronic device may receive an encoded digital content signal, which may correspond to video content in a playable video format that has been encoded according to the wireless communication protocol that is common to the accessory and the remote electronic device.

At operation 604, the remote electronic device may decode the encoded digital content signal to retrieve the digital content signal (e.g., the video content in a playable video format). At operation 606, the remote electronic device displays the video content on its display (e.g., by providing the video content in the playable video format to a display system).

At operation 608, the remote electronic device may receive an encoded partially demodulated digital content signal. At operation 610, the remote electronic device may decode the encoded partially demodulated digital content signal.

At operation 612, the remote electronic device may further demodulate the partially demodulated digital content signal to obtain a second digital content signal (e.g., video content in a playable video format). The remote electronic device may use a demodulation system that is native to the device, and which is used to demodulate other 5G signals. Further demodulating the partially demodulated second digital content signal comprises performing a second signal processing operation of the plurality of signal processing operations.

At operation 614, the remote electronic device displays the video content from the second digital content signal on its display (e.g., by providing the video content in the playable video format to a display system).

Figure 7:
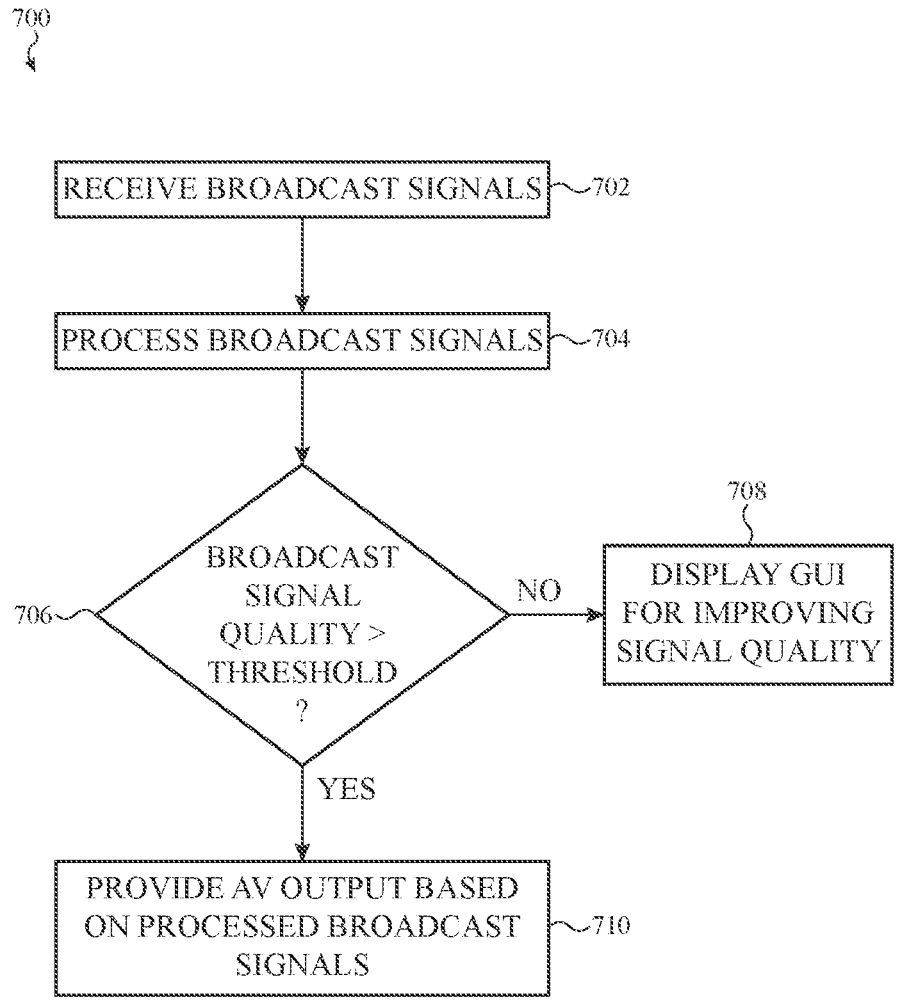
FIG. 7 is a flowchart depicting example operations of a method of operating an accessory for an electronic device and the electronic device, such as described herein.

FIG. 7 is a flow diagram illustrating a method 700 for operating an electronic device and an accessory for the electronic device. At operation 702, broadcast signals are received at the accessory. At operation 704, the broadcast signals are processed. As discussed above, processing of the broadcast signals may occur only at the accessory or at a combination of the accessory and the electronic device. At operation 706, a determination is made whether a quality of the broadcast signals is above a threshold. This may be performed at the accessory, at the electronic device, or at some combination of the above. Determining whether a quality of the broadcast signals is above a threshold may include comparing a signal-to-noise ratio (SNR) of the broadcast signals to the threshold, or examining any other aspect of the broadcast signals. If the quality of the broadcast signals is below the threshold, at operation 708 a graphical user interface may be displayed at the electronic device indicating that the broadcast signal quality is poor or otherwise directing a user to improve the quality of the broadcast signals, for example, by moving the accessory and/or device into or towards a particular location/position. If the quality of the broadcast signals is above the threshold, at operation 710 an AV output based on the processed broadcast signals may be provided at the electronic device as discussed above.

Figure 8:
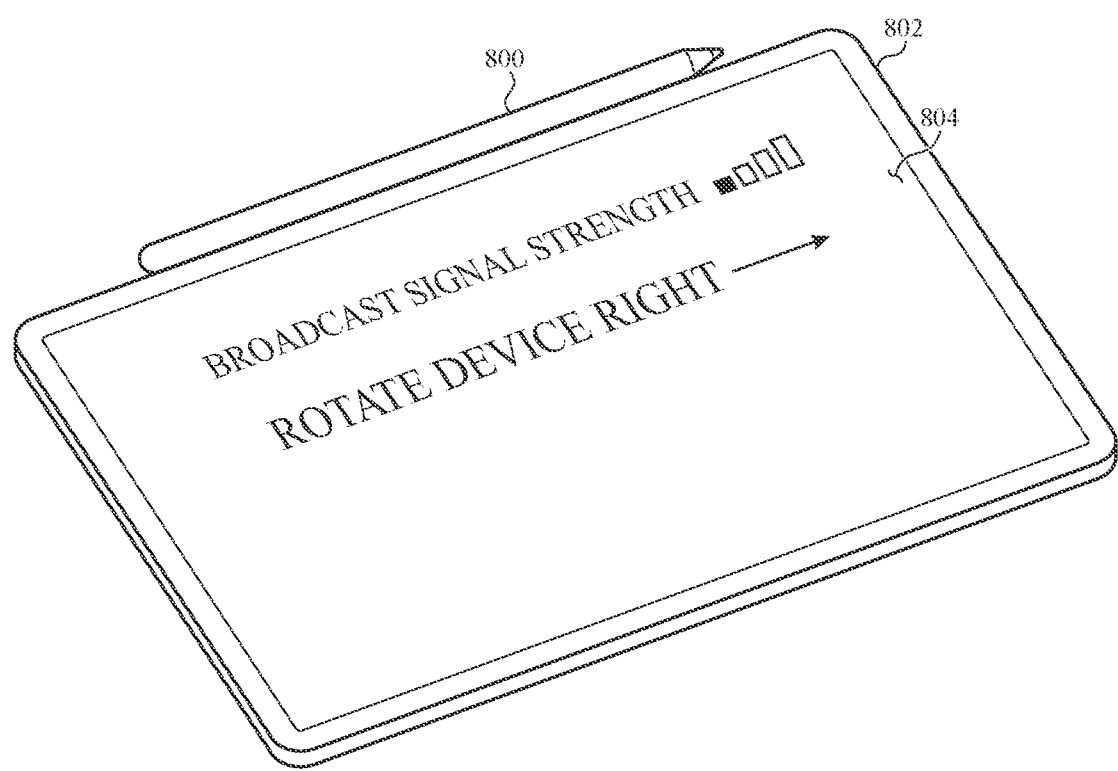
FIG. 8 depicts an accessory for an electronic device and the electronic device showing an exemplary graphical user interface for improving broadcast signal quality, such as described herein.

FIG. 8 shows an exemplary accessory 800 and electronic device 802 displaying a graphical user interface guiding a user to improve the quality of broadcast signals received at the accessory. As shown, the electronic device may render the graphical user interface at a display 804 thereof. The graphical user interface may indicate a quality of the broadcast signals (e.g., using a bar graph), and also provide directions for improving the quality of the broadcast signals, for example, by moving the accessory 800 and/or electronic device 802 in a particular direction. In some cases, a user may be directed to move the accessory 800 independent of the electronic device 802 to improve the quality of the broadcast signals. Due the proximity of the accessory 800 and the electronic device 802, the accessory 800 may have a large degree of flexibility with respect to the electronic device 802 to maintain good signal quality, thereby allowing the accessory 800 to be moved for improved reception of broadcast signals while maintaining a reliable connection with the electronic device 802.

To provide directions for improving the quality of broadcast signals, changes in signal quality of the broadcast signal may be measured with respect to a position of the accessory 800 and/or the electronic device 802. Based on a change in the signal quality, a direction for moving the accessory 800 and/or the electronic device 802 may be suggested. In some cases, signal quality of broadcast signals may be mapped to a particular area and used to suggest changes in position of the accessory 800 and/or electronic device 802.

Figure 9:
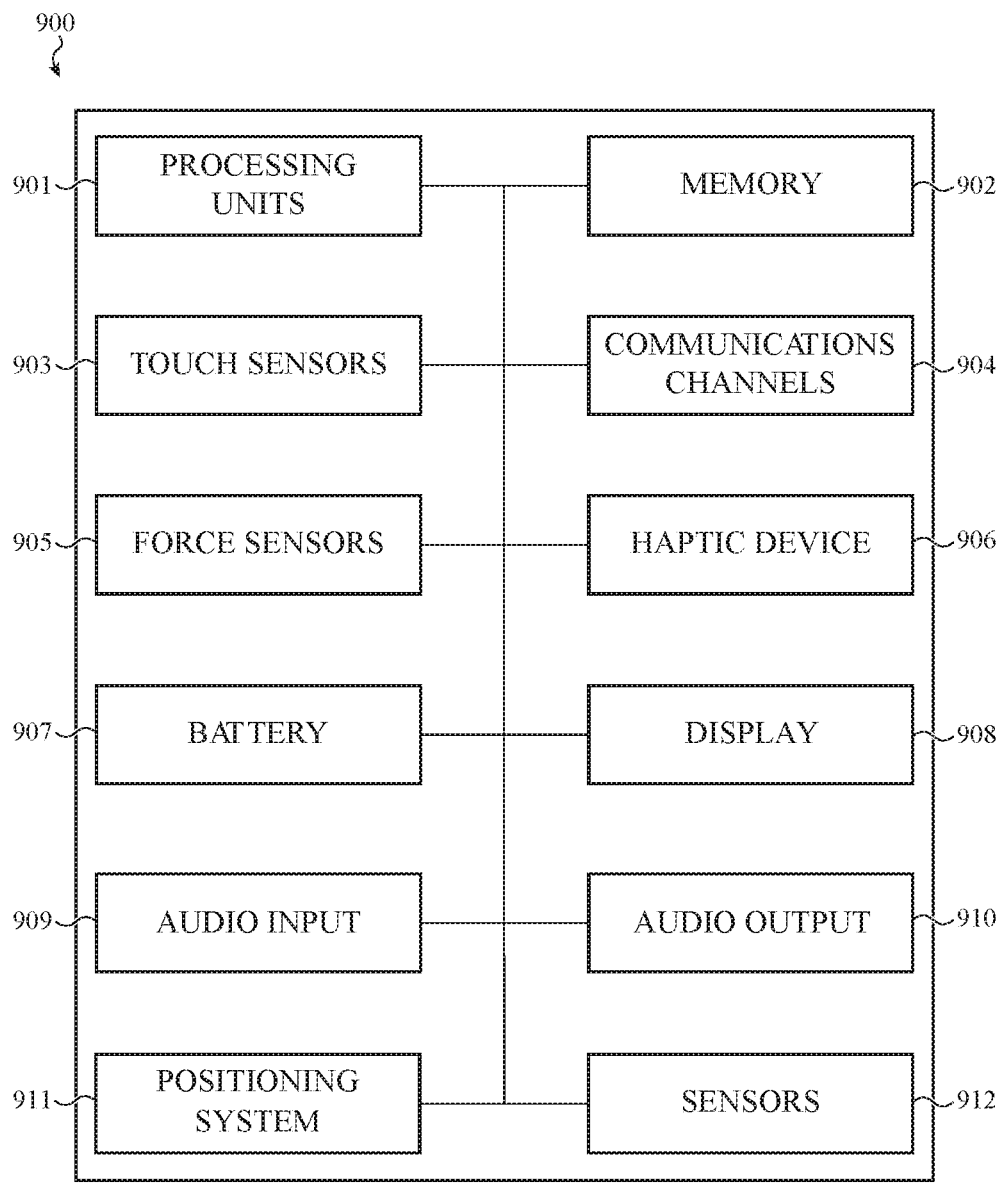
FIG. 9 depicts a schematic diagram of an example electronic device.

FIG. 9 depicts an example schematic diagram of an electronic device 900. The electronic device 900 may be an embodiment of or otherwise represent any of the devices or accessories described herein, such as the accessories 100, 200, 300, 400, and devices 102, 202, 302.

The device 900 includes one or more processors 901 that are configured to access a memory 902 having instructions stored thereon. The instructions or computer programs may be configured to perform one or more of the operations or functions described with respect to the electronic devices described herein. For example, the instructions may be configured to control or coordinate the operation of one or more displays 908, one or more touch sensors 903, one or more force sensors 905, one or more communication channels 904, one or more audio input systems 909, one or more audio output systems 910, one or more positioning systems 911, one or more sensors 912, and/or one or more haptic feedback devices 906.

The processor(s) 901 of FIG. 9 may be implemented as any electronic device capable of processing, receiving, or transmitting data or instructions. For example, the processor(s) 901 may include one or more of: a microprocessor, a central processing unit (CPU), an application-specific integrated circuit (ASIC), a digital signal processor (DSP), or combinations of such devices. As described herein, the term "processor" or "processing system" refers to any software and/or hardware-implemented data processing device(s) or circuit(s) physically and/or structurally configured to instantiate one or more classes or objects that are purpose-configured to perform specific transformations of data including operations represented as code and/or instructions included in a program that can be stored within, and accessed from, a memory. This term is meant to encompass a single processor or processing unit, multiple processors, multiple processing units, or other suitably configured computing element or combination of elements.

The memory 902 can store electronic data that can be used by the device 900. For example, a memory can store electrical data or content such as, for example, audio and video files, images, documents and applications, device settings and user preferences, programs, instructions, timing and control signals or data for the various modules, data structures or databases, and so on. The memory 902 can be configured as any type of memory. By way of example only, the memory can be implemented as random access memory, read-only memory, Flash memory, removable memory, or other types of storage elements, or combinations of such devices. The memory 902 may be coupled to a circuit board assembly.

The touch sensors 903 may detect various types of touch-based inputs and generate signals or data that are able to be accessed using processor instructions. The touch sensors 903 may use any suitable components and may rely on any suitable phenomena to detect physical inputs. For example, the touch sensors 903 may be capacitive touch sensors, resistive touch sensors, acoustic wave sensors, or the like. The touch sensors 903 may include any suitable components for detecting touch-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The touch sensors 903 may be integrated with or otherwise configured to detect touch inputs applied to any portion of the device 900. For example, the touch sensors 903 may be configured to detect touch inputs applied to any portion of the device 900 that includes a display (and may be integrated with a display). The touch sensors 903 may operate in conjunction with the force sensors 905 to generate signals or data in response to touch inputs. A touch sensor or force sensor that is positioned over a display surface or otherwise integrated with a display may be referred to herein as a touch-sensitive display, force-sensitive display, touchscreen display, or touchscreen.

The force sensors 905 may detect various types of force-based inputs and generate signals or data that are able to be accessed using processor instructions. The force sensors 905 may use any suitable components and may rely on any suitable phenomena to detect physical inputs. For example, the force sensors 905 may be strain-based sensors, piezoelectric-based sensors, piezoresistive-based sensors, capacitive sensors, resistive sensors, or the like. The force sensors 905 may include any suitable components for detecting force-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The force sensors 905 may be used in conjunction with various input mechanisms to detect various types of inputs. For example, the force sensors 905 may be used to detect presses or other force inputs that satisfy a force threshold (which may represent a more forceful input than is typical for a standard "touch" input). Like the touch sensors 903, the force sensors 905 may be integrated with or otherwise configured to detect force inputs applied to any portion of the device 900. For example, the force sensors 905 may be configured to detect force inputs applied to any portion of the device 900 that includes a display (and may be integrated with a display). The force sensors 905 may operate in conjunction with the touch sensors 903 to generate signals or data in response to touch- and/or force-based inputs.

The device 900 may also include one or more haptic devices 906. The haptic device 906 may include one or more of a variety of haptic technologies such as, but not necessarily limited to, rotational haptic devices, linear actuators, piezoelectric devices, vibration elements, and so on. In general, the haptic device 906 may be configured to provide punctuated and distinct feedback to a user of the device. More particularly, the haptic device 906 may be adapted to produce a knock or tap sensation and/or a vibration sensation. Such haptic outputs may be provided in response to detection of touch and/or force inputs, and may be imparted to a user through the exterior surface of the device 900 (e.g., via a glass or other surface that acts as a touch- and/or force-sensitive display or surface).

The one or more communication channels 904 may include one or more wireless interface(s) that are adapted to provide communication between the processor(s) 901 and an external device. The one or more communication channels 904 may include antennas (e.g., broadcast antennas, WiFi antennas, Bluetooth antennas), communications circuitry, firmware, software, radio frequency front ends, modulation/demodulation systems, or any other components or systems that facilitate wireless communications with other devices. Antennas may be operably coupled to processing systems to facilitate wireless communications. In general, the one or more communication channels 904 may be configured to transmit and receive data and/or signals that may be interpreted by instructions executed on the processor(s) 901. In some cases, the external device is part of an external communication network that is configured to exchange data with wireless devices. Generally, the wireless interface may communicate via, without limitation, radio frequency, optical, acoustic, and/or magnetic signals and may be configured to operate over a wireless interface or protocol. Example wireless interfaces include radio frequency cellular interfaces (e.g., 2G, 3G, 4G, 4G long-term evolution (LTE), 5G, GSM, CDMA, or the like), broadcast signal interfaces, fiber optic interfaces, acoustic interfaces, Bluetooth interfaces (e.g., for communicating between an accessory and a remote device), infrared interfaces, USB interfaces, Wi-Fi interfaces (e.g., for communicating using Wi-Fi communication standards and/or protocols, including IEEE 802.11, 802.11b, 802.11a, 802.11g, 802.11n, 802.11ac, 802.11ax (Wi-Fi 6, 6E), 802.11be (Wi-Fi 7), or any other suitable Wi-Fi standards and/or protocols), TCP/IP interfaces, network communications interfaces, or any conventional communication interfaces. The one or more communications channels 904 may also include ultra-wideband (UWB) interfaces, which may include any appropriate communications circuitry, instructions, and number and position of suitable UWB antennas.

As shown in FIG. 9, the device 900 may include a battery 907 that is used to store and provide power to the other components of the device 900. The battery 907 may be a rechargeable power supply that is configured to provide power to the device 900. The battery 907 may be coupled to charging systems (e.g., wired and/or wireless charging systems) and/or other circuitry to control the electrical power provided to the battery 907 and to control the electrical power provided from the battery 907 to the device 900.

The device 900 may also include one or more displays 908 configured to display graphical outputs. The displays 908 may use any suitable display technology, including liquid crystal displays (LCD), organic light-emitting diodes (OLED), active-matrix organic light-emitting-diode displays (AMOLED), or the like. The displays may use a low temperature polycrystalline silicone (LTPS) or low temperature polycrystalline oxide (LTPO) backplane. The displays 908 may display graphical user interfaces, images, icons, or any other suitable graphical outputs. The displays 908 may present video content, such as video content from broadcast signals.

The device 900 may also provide audio input functionality via one or more audio input systems 909. The audio input systems 909 may include microphones, transducers, or other devices that capture sound for voice calls, video calls, audio recordings, video recordings, voice commands, and the like.

The device 900 may also provide audio output functionality via one or more audio output systems (e.g., speakers) 910, such as the speaker systems and/or modules described herein. The audio output systems 910 may produce sound from voice calls, video calls, streaming or local audio content, streaming or local video content, or the like.

The device 900 may also include a positioning system 911. The positioning system 911 may be configured to determine the location and/or orientation of the device 900. For example, the positioning system 911 may include magnetometers, gyroscopes, accelerometers, optical sensors, cameras, global positioning system (GPS) receivers, inertial positioning systems, or the like. The positioning system 911 may be used to determine spatial parameters of the device 900, such as the location of the device 900 (e.g., geographical coordinates of the device), measurements or estimates of physical movement of the device 900, an orientation of the device 900, or the like.

The device 900 may also include one or more additional sensors 912 (also referred to as sensing systems) to receive inputs (e.g., from a user or another computer, device, system, network, etc.) or to detect any suitable property or parameter of the device, the environment surrounding the device, people, or things interacting with the device (or nearby the device), or the like. For example, a device may include temperature sensors, biometric sensing systems (e.g., fingerprint sensors, facial recognition systems, photoplethysmographs, blood-oxygen sensors, blood sugar sensors, or the like), eye-tracking sensors, proximity sensors, depth sensors (e.g., time-of-flight based depth or distance sensors), ambient light sensors, retinal scanners, humidity sensors, buttons, switches, lid-closure sensors, or the like.

As noted above, the device 900 may represent other devices described herein, and as such, may instantiate any of the modules, services, signal processing pipelines or operations, or systems described herein, or otherwise provide any of the functionality described herein and/or provided by the described devices. For example, the processor 901 (optionally in conjunction with the memory 902, communications channels 904, and/or other device components and/or systems) may instantiate the broadcast signal processing systems 110, 124, 210, 224, 310, 324, the communications systems 108, 122, 208, 222, 308, 322, 356, 360, the radio frequency front end 350, the demodulators (e.g., partial 5G broadcast demodulator 352, ATSC demodulator 354, the 5G demodulator 362), and the like. It will be understood that functionalities described herein need not be instantiated or otherwise performed by a single system or component, and instead such functionalities may be provided by systems or components (or portions thereof) operating in conjunction.

To the extent that multiple functionalities, operations, and structures described with reference to FIG. 9 are disclosed as being part of, incorporated into, or performed by the device 900, it should be understood that various embodiments may omit any or all such described functionalities, operations, and structures. Thus, different embodiments of the device 900 may have some, none, or all of the various capabilities, apparatuses, physical features, modes, and operating parameters discussed herein. Further, the systems included in the device 900 are not exclusive, and the device 900 may include alternative or additional systems, components, modules, programs, instructions, or the like, that may be necessary or useful to perform the functions described herein.

These foregoing embodiments depicted in FIGS. 1A-9 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. A stylus usable with an electronic device to provide an input to the electronic device, comprising:
   a stylus body;
   a battery within the stylus body;
   a first antenna configured to receive;
      a first broadcast signal encoded according to a first broadcast protocol, the first broadcast signal including first video content; and
      a second broadcast signal encoded according to a second broadcast protocol different from the first broadcast protocol, the second broadcast signal including second video content;
   a second antenna configured to communicate with a remote electronic device via a wireless communication protocol;
   a processing system within the stylus body and configured to:
      receive the first broadcast signal from the first antenna;
      demodulate the first broadcast signal to produce a first digital content signal including the first video content; and
      receive the second broadcast signal from the first antenna;
      partially demodulate the second broadcast signal to produce a partially demodulated second digital content signal;
   a communication system within the stylus body and configured to:
      receive the first digital content signal and the second digital content signal from the processing system;
      encode the first digital content signal according to the wireless communication protocol to produce an encoded first digital content signal;
      encode the partially demodulated second digital content signal according to the wireless communication protocol to produce an encoded partially demodulated second digital content signal; and
      send to the remote electronic device, via the second antenna, the encoded first digital content signal and the encoded partially demodulated second digital content signal.

2. The stylus of claim 1, wherein:
   the stylus further includes an input sensing system configured to detect a user input at the stylus; and
   the communication system is further configured to, in response to detecting the user input, send an input signal, via the second antenna and using the wireless communication protocol, to the remote electronic device.

3. The stylus of claim 2, wherein:
   the first broadcast signal is transmitted on a first frequency band;
   the second broadcast signal is transmitted on a second frequency band; and
   the first antenna is configured to receive signals on the first frequency band and the second frequency band.

4. The stylus of claim 2, further comprising a magnetic attachment mechanism coupled to the stylus body and configured to magnetically attach the stylus to the remote electronic device.

5. The stylus of claim 2, wherein:
the first broadcast protocol is an Advanced Television Systems Committee (ATSC) broadcast protocol;
the second broadcast protocol is a fifth generation (5G) broadcast protocol; and
the wireless communication protocol is a Bluetooth communication protocol.

6. The stylus of claim 2, wherein:
the video content is first video content;
the second broadcast signal includes second video content; and
the encoded partially demodulated second digital content signal includes the second video content.

7. The stylus of claim 1, wherein the partially demodulated second digital content signal requires additional demodulation in order to access the second video content.

8. An electronic device system comprising:
an electronic device comprising:
a housing;
a display coupled to the housing and configured to display graphical outputs; and
a cover over the display and defining a front exterior surface of the electronic device; and
an accessory configured to be removably coupled to the electronic device and comprising:
an attachment mechanism configured to removably couple the accessory to the electronic device;
a first antenna configured to receive:
a first broadcast signal encoded according to a first broadcast protocol, the first broadcast signal including first video content; and
a second broadcast signal encoded according to a second broadcast protocol different from the first broadcast protocol, the second broadcast signal including second video content;
a second antenna configured to communicate with the electronic device;
a processing system configured to:
receive the first broadcast signal from the first antenna;
demodulate the first broadcast signal to produce a first digital content signal including the first video content;
encode the first digital content signal according to a wireless communication protocol to produce an encoded first digital content signal;
receive the second broadcast signal from the first antenna;
partially demodulate the second broadcast signal to produce a partially demodulated second digital content signal;
encode the partially demodulated second digital content signal according to the wireless communication protocol to produce an encoded partially demodulated second digital content signal; and
send to the electronic device, via the second antenna, the encoded first digital content signal and the encoded partially demodulated second digital content signal.

9. The electronic device system of claim 8, wherein the electronic device is a tablet computer.

10. The electronic device system of claim 9, wherein the accessory is a stylus configured to provide an input to the tablet computer via contact with the cover.

11. The electronic device system of claim 8, wherein:
the processing system is a first processing system; and
the electronic device comprises a second processing system configured to:
receive the encoded first digital content signal;
decode the encoded first digital content signal to retrieve the first digital content signal; and
display the first video content on the display using the first digital content signal.

12. The electronic device system of claim 11, wherein the second processing system of the electronic device is further configured to:
receive the encoded partially demodulated second digital content signal;
decode the encoded partially demodulated second digital content signal to retrieve the partially demodulated second digital content signal;
further demodulate the partially demodulated second digital content signal to retrieve the second digital content signal; and
display the second video content on the display using the second digital content signal.

13. The electronic device system of claim 12, wherein:
partially demodulating the second broadcast signal comprises performing one or more first signal processing operations of a plurality of signal processing operations of a demodulation pipeline; and
further demodulating the partially demodulated second digital content signal comprises performing one or more second signal processing operations of the plurality of signal processing operations.

14. The electronic device system of claim 8, wherein the partially demodulated second digital content signal requires additional demodulation in order to access the second video content.

15. An accessory for use with an electronic device, comprising:
a housing;
an attachment mechanism coupled to the housing and configured to removably attach the accessory to an electronic device;
a processing system within the housing;
a first antenna operably coupled to the processing system and configured to receive:
a first broadcast signal encoded according to a first broadcast protocol, the first broadcast signal including first video content; and
a second broadcast signal encoded according to a second broadcast protocol different from the first broadcast protocol, the second broadcast signal including second video content;
a second antenna operably coupled to the processing system and configured to communicate with the electronic device via a wireless communication protocol, wherein
the processing system is configured to:
receive the first broadcast signal from the first antenna;
demodulate the first broadcast signal to produce a first digital content signal including the first video content;
encode the first digital content signal according to the wireless communication protocol to produce an encoded first digital content signal;
receive the second broadcast signal from the first antenna;
partially demodulate the second broadcast signal to produce a partially demodulated second digital content signal;

encode the partially demodulated second digital content signal according to the wireless communication protocol to produce an encoded partially demodulated second digital content signal; and send to the electronic device, via the second antenna, the encoded first digital content signal and the encoded partially demodulated second digital content signal.

16. The accessory of claim 15, further comprising:

a battery; and a wireless charging system coupled to the battery, the wireless charging system configured to:

wirelessly receive power from the electronic device; and charge the battery using the power received from the electronic device.

17. The accessory of claim 16, wherein the attachment mechanism comprises a magnetic mounting system comprising one or more magnets configured to magnetically couple the accessory to the electronic device.

18. The accessory of claim 15, wherein the accessory is an input accessory configured to provide a user input to the electronic device.

19. The accessory of claim 15, wherein:

the accessory further includes an input sensing system configured to detect a user input at the accessory; and the processing system is further configured to, in response to detecting the user input, send an input signal, via the second antenna and using the wireless communication protocol, to the electronic device.

20. The accessory of claim 19, wherein the input sensing system comprises at least one of:

an accelerometer configured to detect a tap input applied to the accessory; or a button configured to receive an actuation input.

* * * * *